(12) United States Patent
Ge et al.

(10) Patent No.: US 7,029,994 B2
(45) Date of Patent: Apr. 18, 2006

(54) STRAINED CHANNEL ON INSULATOR DEVICE

(75) Inventors: Chung-Hu Ge, Taipei (TW);
Chao-Hsiung Wang, Hsin-Chu (TW);
Chien-Chao Huang, Hsin-Chu (TW);
Wen-Chin Lee, Hsin-Chu (TW);
Chenming Hu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 11/083,537

(22) Filed: Mar. 18, 2005

(65) Prior Publication Data

US 2005/0233552 A1    Oct. 20, 2005

Related U.S. Application Data

(62) Division of application No. 10/407,761, filed on Apr. 3, 2003, now Pat. No. 6,900,502.

(51) Int. Cl.
*H01L 21/20*    (2006.01)

(52) U.S. Cl. ........................ 438/479; 257/347
(58) Field of Classification Search ........... 257/347; 438/479
See application file for complete search history.

(56) References Cited

U.S. PATENT DOCUMENTS

| | | |
|---|---|---|
| 4,069,094 A | 1/1978 | Shaw et al. |
| 4,314,269 A | 2/1982 | Fujiki |
| 4,497,683 A | 2/1985 | Celler et al. |
| 4,631,803 A | 12/1986 | Hunter et al. |
| 4,892,614 A | 1/1990 | Chapman et al. |
| 4,946,799 A | 8/1990 | Blake et al. |
| 4,952,993 A | 8/1990 | Okumura |
| 5,130,773 A | 7/1992 | Tsukada |
| 5,155,571 A | 10/1992 | Wang et al. |
| 5,273,915 A | 12/1993 | Hwang et al. |
| 5,338,960 A | 8/1994 | Beasom |
| 5,378,919 A | 1/1995 | Ochial |
| 5,447,884 A | 9/1995 | Fahey et al. |
| 5,461,250 A | 10/1995 | Burghartz et al. |
| 5,479,033 A | 12/1995 | Baca et al. |
| 5,534,713 A | 7/1996 | Ismail et al. |
| 5,596,529 A | 1/1997 | Noda et al. |
| 5,629,544 A | 5/1997 | Voldman et al. |
| 5,656,524 A | 8/1997 | Eklund et al. |
| 5,708,288 A | 1/1998 | Quigley et al. |

(Continued)

FOREIGN PATENT DOCUMENTS

EP    0 683 522 A2    11/1995

(Continued)

OTHER PUBLICATIONS

"Future Gate Stack," International Sematech, 2001 Annual Report.

(Continued)

*Primary Examiner*—Edward Wojciechowicz
(74) *Attorney, Agent, or Firm*—Slater & Matsil, L.L.P.

(57) ABSTRACT

A semiconductor device 10 includes a substrate 12 (e.g., a silicon substrate) with an insulating layer 14 (e.g., an oxide such as silicon dioxide) disposed thereon. A first semiconducting material layer 16 (e.g., SiGe) is disposed on the insulating layer 14 and a second semiconducting material layer 18 (e.g., Si) is disposed on the first semiconducting material layer 16. The first and second semiconducting material layers 16 and 18 preferably have different lattice constants such that the first semiconducting material layer 16 is compressive and the second semiconducting material layer is tensile 18.

24 Claims, 2 Drawing Sheets

U.S. PATENT DOCUMENTS

| | | | |
|---|---|---|---|
| 5,714,777 A | 2/1998 | Ismail et al. | |
| 5,763,315 A | 6/1998 | Benedict et al. | |
| 5,789,807 A | 8/1998 | Correale, Jr. | |
| 5,811,857 A | 9/1998 | Assaderaghi et al. | |
| 5,955,766 A | 9/1999 | Ibi et al. | |
| 6,008,095 A | 12/1999 | Gardner et al. | |
| 6,015,990 A | 1/2000 | Hieda et al. | |
| 6,015,993 A | 1/2000 | Voldman et al. | |
| 6,046,487 A | 4/2000 | Benedict et al. | |
| 6,059,895 A | 5/2000 | Chu et al. | |
| 6,100,153 A | 8/2000 | Nowak et al. | |
| 6,111,267 A | 8/2000 | Fischer et al. | |
| 6,222,234 B1 | 4/2001 | Imai | |
| 6,232,163 B1 | 5/2001 | Voldman et al. | |
| 6,256,239 B1 | 7/2001 | Akita et al. | |
| 6,258,664 B1 | 7/2001 | Reinberg | |
| 6,281,059 B1 | 8/2001 | Cheng et al. | |
| 6,291,321 B1 | 9/2001 | Fitzgerald | |
| 6,294,834 B1 | 9/2001 | Yeh et al. | |
| 6,339,232 B1 * | 1/2002 | Takagi | 257/192 |
| 6,358,791 B1 | 3/2002 | Hsu et al. | |
| 6,387,739 B1 | 5/2002 | Smith, III | |
| 6,407,406 B1 | 6/2002 | Tezuka | |
| 6,413,802 B1 | 7/2002 | Hu et al. | |
| 6,414,355 B1 | 7/2002 | An et al. | |
| 6,429,061 B1 | 8/2002 | Rim | |
| 6,448,114 B1 | 9/2002 | An et al. | |
| 6,448,613 B1 | 9/2002 | Yu | |
| 6,475,838 B1 | 11/2002 | Bryant et al. | |
| 6,475,869 B1 | 11/2002 | Yu | |
| 6,489,664 B1 | 12/2002 | Re et al. | |
| 6,498,359 B1 | 12/2002 | Schmidt et al. | |
| 6,518,610 B1 | 2/2003 | Yang et al. | |
| 6,521,852 B1 | 2/2003 | Ker et al. | |
| 6,524,905 B1 | 2/2003 | Yamamichi et al. | |
| 6,525,403 B1 | 2/2003 | Inaba et al. | |
| 6,555,839 B1 | 4/2003 | Fitzgerald | |
| 6,558,998 B1 | 5/2003 | Belleville et al. | |
| 6,573,172 B1 | 6/2003 | En et al. | |
| 6,576,526 B1 | 6/2003 | Kai et al. | |
| 6,586,311 B1 | 7/2003 | Wu | |
| 6,600,170 B1 | 7/2003 | Xiang | |
| 6,617,643 B1 | 9/2003 | Goodwin-Johansson | |
| 6,621,131 B1 | 9/2003 | Murthy et al. | |
| 6,633,070 B1 | 10/2003 | Miura et al. | |
| 6,653,700 B1 | 11/2003 | Chau et al. | |
| 6,657,276 B1 | 12/2003 | Karlsson et al. | |
| 6,686,247 B1 | 2/2004 | Bohr | |
| 6,720,619 B1 | 4/2004 | Chen et al. | |
| 6,724,019 B1 | 4/2004 | Oda et al. | |
| 6,759,717 B1 | 7/2004 | Sagarwala et al. | |
| 6,762,448 B1 | 7/2004 | Lin et al. | |
| 6,784,101 B1 | 8/2004 | Yu et al. | |
| 6,794,764 B1 | 9/2004 | Kamal et al. | |
| 6,803,641 B1 | 10/2004 | Papa Rao et al. | |
| 6,885,084 B1 | 4/2005 | Murthy et al. | |
| 2002/0031890 A1 | 3/2002 | Watanabe et al. | |
| 2002/0074598 A1 | 6/2002 | Doyle et al. | |
| 2002/0076899 A1 | 6/2002 | Skotnicki et al. | |
| 2002/0125471 A1 | 9/2002 | Fitzgerald et al. | |
| 2002/0153549 A1 | 10/2002 | Lalbowitz et al. | |
| 2002/0190284 A1 | 12/2002 | Murthy et al. | |
| 2003/0001219 A1 | 1/2003 | Chau et al. | |
| 2003/0030091 A1 | 2/2003 | Bulsara et al. | |
| 2003/0080388 A1 | 5/2003 | Ker et al. | |
| 2004/0026765 A1 | 2/2004 | Currie et al. | |
| 2004/0173815 A1 | 9/2004 | Yeo et al. | |
| 2004/0217448 A1 | 11/2004 | Kumagai et al. | |
| 2005/0029601 A1 | 2/2005 | Chen et al. | |

FOREIGN PATENT DOCUMENTS

| | | |
|---|---|---|
| EP | 0 828 296 A2 | 3/1998 |
| WO | WO 03/017336 A2 | 2/2003 |

OTHER PUBLICATIONS

Blaauw, D., et al., "Gate Oxide and Subthreshold Leakage Characterization, Analysis and Optimization," date unknown.

Cavassilas, N., et al., "Capacitance-Voltage Characteristics of Metal-Oxide-Strained Semiconductor Si/SiGe Heterostructures," Nanotech 2002, vol. 1, pp. 600-603.

Chang, L., et al., "Direct-Tunneling Gate Leakage Current in Double-Gate and Ultrathin Body MOSFETs," 2002 IEEE Transactions on Electron Devices, vol. 49, No. 12, Dec. 2002, pp. 2288-2295.

Chang, L., et al., "Reduction of Direct-Tunneling Gate Leakage Current in Double-Gate and Ultra-Thin Body MOSFETs," IEEE, 2001, pp. 4 pages.

Gámiz, F., et al., "Electron Transport in Strained Si Inversion Layers Grown on SiGe-on-Insulator Substrates," Journal of Applied Physics, vol. 92, No. 1, Jul. 1, 2002, pp. 288-295.

Gámiz, F., et al., "Strained-Si/SiGe-on-Insulator Inversion Layers: The Role of Strained-Si Layer Thickness on Electron Mobility," Applied Physics Letter, vol. 80, No. 22, Jun. 3, 2002, pp. 4160-4162.

Huang, X., et al., "Sub-50 nm P-Channel FinFET," IEEE Transactions on Electron Devices, vol. 48, No. 5, May 2001, pp. 880-886.

Ismail, K, et al., "Electron Transport Properties of Si/SiGe Heterostructures: Measurements and Device Implications," Applied Physics Letter, vol. 63, No. 5, Aug. 2, 1993, pp. 660-662.

Jurczak, M., "Silicon-on-Nothing (SON)—an Innovative Process for Advanced CMOS," IEEE Transactions on Electron Devices, vol. 47, No. 11, Nov. 2000, pp. 2179-2187.

Jurczak, M., et al., "SON (Silicon on Nothing)—A New Device Architecture For the ULSI Era," Symposium on VLSI Technology Digest of Technical Papers, 1999, 29-30.

Leitz, C.W. et al., "Channel Engineering of SiGe-Based Heterostructures for High Mobility MOSFETs," Materials Research Society Symposium Proceedings, vol. 686, 2002, pp. 113-118.

Leitz, C.W., et al., "Hole Mobility Enhancements In Strained Si/Si$_{1-y}$Ge$_y$ P-Type Metal-Oxide-Semiconductor Field-Effect Transistors Grown on Relaxed Si$_{1-x}$Ge$_x$ (x<y) Virtual Substrates," Applied Physics Letters, vol. 79, No. 25, Dec. 17, 2001, pp. 4246-4248.

Liu, K.C., et al., "A Novel Sidewall Strained-Si Channel nMOSFET," IEDM, 1999, pp. 63-66.

Maiti, C.K., et al., "Film Growth and Material Parameters," Application of Silicon-Germanium Heterostructure, Institute of Physics Publishing, Ch. 2.

Matthews, J.W., "Defects Associated with the Accomodation of Misfit Between Crystals," J. Vac. Sci. Technol., vol. 12, No. 1, Jan./Feb. 1975, pp. 126-133.

Matthews, J.W., et al., "Defects in Epitaxial Multilayers—I. Misfit Dislocations," Journal of Crystal Growth, vol. 27, 1974, pp. 118-125.

Matthews, J.W., et al., "Defects in Epitaxial Multilayers—II. Dislocation Pile-Ups, Threading Dislocations, Slip Lines and Cracks," Journal of Crystal Growth, vol. 29, 1975, pp. 273-280.

Matthews, J.W., et al., "Defects in Epitaxial Multilayers—III. Preparation of Almost Perfect Multilayers," Journal of Crystal Growth, vol. 32, 1976, pp. 265-273.

Mizuno, T., et al., "Novel SOI p-Channel MOSFETs With Higher Strain in Si Channel Using Double SiGe Heterostructures," IEEE Transactions on Electron Devices, vol. 49, No. 1, Jan. 2002, pp. 7-14.

Nayak, D.K., et al., "Enhancement-Mode Quantum-Well $Ge_x Sl_{1-x}$ PMOS," IEEE Electron Device Letters, vol. 12, No. 4, Apr. 1991, pp. 154-156.

Ootsuka, F., et al., "A Highly Dense, High-Performance 130nm Node CMOS Technology for Large Scale System-on-a-Chip Application," International Electron Device Meeting, 2000, pp. 575-578.

Schüppen, A., et al., "Mesa and Planar SiGe-HBTs on MBE-Wafers," Journal of Materials Science: Materials in Electronics, vol. 6, 1995, pp. 298-305.

Shahidi, G.G., "SOI Technology for the GHz Era," IBM J. Res. & Dev., vol. 46, No. 2/3, Mar./May 2002, pp. 121-131.

Shimizu, A., et al., "Local Mechanical-Stress Control (LMC): A New Technique for CMOS-Performance Enhancement," IEDM 2001, pp. 433-436.

Tezuka, T., et al., "High-Performance Strained Sl-on-Insulator MOSFETs by Novel Fabrication Processes Utilizing Ge-Condensation Technique," Symposium On VLSI Technology Digest of Technical Papers, 2002, pp. 96-97.

Thompson, S., et al., "A 90 nm Logic Technology Featuring 50nm Strained Silicon Channel Transistors, 7 Layers of Cu Interconnects, Low k ILD, and 1 $um^2$ SRAM Cell," IEDM, Dec. 2002, pp. 61-64.

Tiwari, S., et al. "Hole Mobility Improvement in Silicon-on-Insulator and Bulk Silicon Transistors Using Local Strain," International Electron Device Meeting, 1997, pp. 939-941.

Wang, L.K., et al., "On-Chip Decoupling Capacitor Design to Reduce Switching-Noise-Induced Instability in CMOS/SOI VLSI," Proceedings of the 1995 IEEE International SOI Conference, Oct. 1995, pp. 100-101.

Welser, J., et al., "NMOS and PMOS Transistors Fabricated in Strained Silicon/Relaxed Silicon-Germanium Structures," IEDM, 1992, pp. 1000-1002.

Wong, H.-S.P., "Beyond the Conventional Transistor," IBM J. Res. & Dev., vol. 46, No. 2/3, Mar./May 2002, pp. 133-167.

Yang, F.L., et al, "35nm CMOS FinFETs," Symposium on VLSI Technology Digest of Technical Papers, 2002, pp. 104-105.

Yang, F.L., et al., "25 nm CMOS Omega FETs," IEDM, 2002, pp. 255-258.

Yeoh, J.C., et al., "MOS Gated Si:SiGe Quantum Wells Formed by Anodic Oxidation," Semicond. Sci. Technol., vol. 13, 1998, pp. 1442-1445.

Wolf, S., et al., "Silicon Processing For The VLSI ERA," vol. 1: Process Technology, Second Edition, Lattice Press, Sunset Beach, California, 2000, pp. 834-835.

Wolf, S., "Silicon Processing For The VLSI ERA," vol. 2: Process Integration, Lattice Press, Sunset Beach, California, 1990, pp. 144-145.

\* cited by examiner

STRAINED CHANNEL ON INSULATOR DEVICE

This application is a divisional of patent application Ser. No. 10/407,761, entitled "Strained Channel On Insulator Device," filed on Apr. 3, 2003, now U.S. Pat. No. 6,900,502 which application is incorporated herein by reference.

TECHNICAL FIELD

The present invention relates generally to integrated circuits, and more particularly to a strained channel on insulator device and method for forming the same.

BACKGROUND

Typical commercial semiconductor devices are formed from silicon. In these devices, regions of the silicon are doped with impurities to vary the conductivity and form junctions, which can be used to form, for example, transistors. In most commercially available devices, these transistor devices are formed in a semiconductor substrate. For example, the devices may be formed within a lightly doped well within a monocrystalline silicon substrate. In other devices, known as silicon-on-insulator (SOI), a silicon layer is formed over an insulating layer, which is formed on the substrate. Transistor devices can then be formed in the upper silicon layer.

Enhanced electron mobility in silicon under tensile channel strain and enhanced hole mobility in silicon-germanium (SiGe) under compressive channel strain have been reported. See e.g., Ismail et al., "Electron transport properties of Si/SiGe heterostructures: Measurements and device implications," Applied Physics Letters Vol. 63, No. 5, 2 Aug. 1993, pp. 660–662; and Nayak et al., "Enhancement-Mode Quantum-Well $Ge_xSi_{1-x}$ PMOS," IEEE Electron Device Letters, Vol. 12, No. 4, April 1991, pp. 154–156. Both of these papers are incorporated herein by reference.

Recent studies have shown the feasibility of strained Si/SiGe-on-Insulator (SiGe-OI) structure. For example, Gamiz et al. have shown by Monte Carlo simulation that electron mobility is greater when strained-silicon inversion layers are grown on SiGe-on-insulator substrates than when unstrained-silicon-on-insulator devices are employed. Gamiz et al., "Strained-Si/SiGe-on-insulator inversion layers: The role of strained-Si layer thickness on electron mobility," Applied Physics Letters, vol. 80, no. 22, 3 Jun. 2002, pp. 4160–62; see also Gamiz et al., "Electron Transport in strained Si inversion layers grown on SiGe-on-insulator substrates," Journal of Applied Physics, vol. 92, no. 1, 1 Jul. 2002, pp. 288–295. Both of these papers are incorporated herein by reference.

Mizuno et al. have studied p-channel advanced SOI MOSFETs using double SiGe heterostructures fabricated by the combination of SIMOX and high-quality strained-Si/SiGe regrowth technologies, in order to introduce higher strain in the silicon channel. Mizuno et al., "Novel SOI p-Channel MOSFETs With Higher Strain in Si Channel Using Double SiGe Heterostructures," IEEE Transactions on Electron Devices, vol. 49, no. 1, January 2002, pp. 7–14; see also Tezuka et al., "High-performance Strained Si-on-Insulator MOSFETs by Novel Fabrication Processes Utilizing Ge-Condensation Technique," 2002 Symposium on VLSI Technology Digest of Technical Papers, pp. 97—97. Both of these papers are incorporated herein by reference.

SUMMARY OF THE INVENTION

The present invention includes embodiments of semiconductor devices that have enhanced electron and hole mobility, for example in CMOS devices. With certain embodiments, both the NMOS and the PMOS devices can be formed in a single layer and both can experience the speed advantages of a properly stressed material.

In one embodiment, for example, a semiconductor device includes a substrate (e.g., a silicon substrate) with an insulating layer (e.g., an oxide such as silicon dioxide) disposed thereon. A first semiconducting material layer (e.g., SiGe) is disposed on the insulating layer and a second semiconducting material layer (e.g., Si) is disposed on the first semiconducting material layer. The first and second semiconducting material layers preferably have different lattice constants in the relaxed state such that, when adjacent, the first semiconducting material layer is compressive and the second semiconducting material layer is tensile.

A method of making an embodiment device of the present invention includes forming a first epitaxial $Si_{1-x}Ge_x$ layer over the SOI substrate. The $Si_{1-x}Ge_x$ layer is oxidized so that Ge atoms are driven from an upper surface of the $Si_{1-x}Ge_x$ layer into the remaining portion of the $Si_{1-x}Ge_x$ layer and the silicon layer of the SOI substrate. This process forms a relaxed $Si_{1-y}Ge_y$ layer (preferably y is greater than x). The oxide layer that was formed during oxidation is removed and a second silicon layer is formed over the $Si_{1-y}Ge_y$ layer. Preferably, the second silicon layer induces a compressive stress in the relaxed $Si_{1-y}Ge_y$ layer.

In preferred embodiments, the present invention provides simple structures for adjusting the channel strain of an electronic device. As an example, embodiments of the present invention provide techniques that allow design engineers to use stress engineering to optimize NMOS/PMOS ration to optimize device performance.

BRIEF DESCRIPTION OF THE DRAWINGS

For a more complete following descriptions taken in conjunction with the accompanying drawings, in which understanding of the present invention, and the advantages thereof, reference is now made to the.

DETAILED DESCRIPTION OF ILLUSTRATIVE EMBODIMENTS

Figure 1:
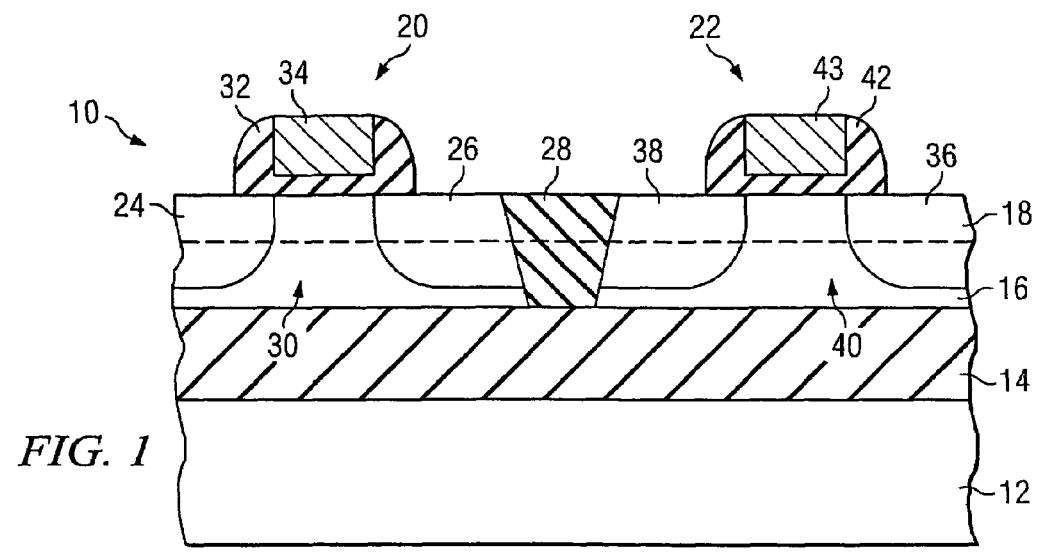
FIG. 1 is a cross-sectional view of a first embodiment of the present invention.

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

A first embodiment of the present invention will be described with respect to FIG. 1, which shows a semiconductor device 10. The semiconductor device 10 is preferably formed on a semiconductor-on-insulator (SOI) substrate. In this case, the SOI substrate includes a substrate 12 and an insulating layer 14 disposed on the substrate 12. In the preferred embodiment, the substrate 12 is a monocrystalline silicon substrate. This substrate can be lightly doped, although doping is not necessary. Other materials such as germanium, quartz, sapphire, and glass could alternatively be used as the substrate material.

In the preferred embodiment, the insulating layer 14 is an oxide such as silicon dioxide ($SiO_2$). This layer can be formed to a thickness of between about 100 nm and about 200 nm. The present invention does not limit the method in which the insulating layer is formed. For example, an oxide layer 14 can be deposited or thermally grown on the substrate 12. Alternatively, the oxide layer 14 can be formed by implanting an oxygen bearing species into the substrate, e.g., using a SIMOX process. Alternatively, other insulators such as nitrides or an air gap (e.g., SON or silicon on nothing) can be used.

A first semiconducting material layer 16 is disposed on the insulating layer; The first semiconducting material is characterized as having a compressive stress. A second semiconducting material layer 18 is disposed on the first semiconducting material layer 16. The second semiconducting material 18 is characterized as having a tensile stress. In the preferred embodiment, the stresses are created due to the fact that semiconducting materials that form layers 16 and 18 have different lattice constants in the relaxed state. When these two materials are joined, the lattice constant at the interface will be forced to be the same, which causes the stresses in the layers.

The first and second semiconducting material layers 16 and 18 can comprises any of a large number of semiconductors, such as alloy semiconductors, elemental semiconductors, or compound semiconductors. In the preferred embodiment, the first semiconducting material 16 is silicon germanium (SiGe) and the second semiconducting material 18 is silicon (Si). Other combinations of materials are also envisioned.

In the preferred embodiment, the first and second semiconducting material layers 16 and 18 have a combined thickness of less than about 40 nm (400 Å). For example, the first layer 16 may be a SiGe layer with a thickness less than about 400 Å and the second layer 18 may be a Si layer with a thickness less than about 400 Å. This example is useful for semiconductor devices built with 90 nm minimum design features. The thicknesses can vary (e.g., get smaller) as the design features vary (e.g., get smaller). In the preferred embodiment, the ratio of the thickness of the second semiconducting material layer 18 to the thickness of the first semiconducting material is greater than about 0.3.

The thickness of second layer 18 preferably has a thickness that is less than the critical thickness. The critical thickness is the thickness at which it becomes energetically favorable for misfit dislocations to be made.

In the embodiment illustrated in FIG. 1, a CMOS (complementary metal oxide semiconductor) pair of transistors has been formed in the semiconducting material layers 16 and 18. The CMOS pair includes a first transistor 20 and a second transistor 22. The first transistor 20 includes a source region 24 and a drain region 26, both of which extend within the first and second semiconducting material layers 16 and 18. The drain region 26 is spaced from the source region 24 by a channel region 30. The selection of which region 24 or 26 is the source and which is the drain is arbitrary and the labels could be reversed in a particular circuit (and as a result both the source and drain can be referred to as a source/drain region). A gate-insulating layer 32 (e.g., an oxide and/or nitride) overlies the channel region 30 and a conductive gate 34 (e.g., polysilicon and/or silicide) overlies the gate-insulating layer 32.

Similarly, the second transistor 22 includes a source region 36 and a drain region 38, both of which extend within the first and second semiconducting material layers 16 and 18. The drain region 38 is spaced from the source region 36 by a channel region 40. As before, the selection of which region 36 or 38 is the source and which is the drain is arbitrary and the labels could be reversed in a particular circuit. A gate-insulating layer 42 (e.g., an oxide and/or nitride) overlies the channel region 40 and a conductive gate 43 (e.g., polysilicon and/or silicide) overlies the gate-insulating layer 42.

In this example, the first transistor 20 is a p-channel transistor and the second transistor 22 is an n-channel transistor. In this case, the source/drain regions 24 and 26 are preferably heavily doped with a p-type dopant such as boron and the channel 30 is more lightly doped with an n-type dopant such as arsenic or phosphorus. The source/drain regions 36 and 38 are preferably heavily doped with an n-type dopant such as arsenic or phosphorus and the channel 40 is more lightly doped with a p-type dopant such as boron.

An isolation region 28 can isolate the p-channel transistor 20 and the n-channel transistor 22. In the preferred embodiment, the isolation region 28 is formed from a dielectric such as silicon dioxide ($SiO_2$). For example, region 28 could be formed by standard shallow trench isolation (STI) or local oxidation of silicon (LOCOS) processes. Alternatively, isolation region 28 could be formed from other materials such as silicon nitride (e.g., $Si_3N_4$) or nothing (mesa method). Although only one isolation region is shown, a typical device 10 would include a plurality of isolation regions.

In the preferred embodiment, the isolation region 28 is formed adjacent the first and second semiconducting material layer 16 and 18 so as to induce a compressive strain on the first semiconducting material layer 16 and/or a tensile strain on the second semiconducting material layer 18.

The isolation region 28 can induce strain in at least three ways. For example, when an isolation trench is used, a trench liner (not shown) can be formed in a manner than induces stress. As another example, when the trench is filled a stress is intrinsically induced. Likewise, in the case of thermal oxidation, a stress can be induced in the layer during the LOCOS process. As a final example, the volume of the trench filling material can be decreased (or increased) by thermal (or other) treatment.

In addition, source/drain regions 24, 26, 36 and 38 are preferably strained source/drain regions. A strained source/drain is a doped region formed adjacent to the gate in a strained region. The strained source/drain regions induce more tensile strain on the second semiconducting material layer 18 or more compressive strain on the first semiconducting material layer 16. The source/drain regions 24, 26, 36 and 38 can induce more stress due to the larger or smaller atom sizes of different implantations species. In addition, a silicide layer (not shown) can be formed over the source/drain regions. This silicide layer can induce additional stress.

Figure 2:
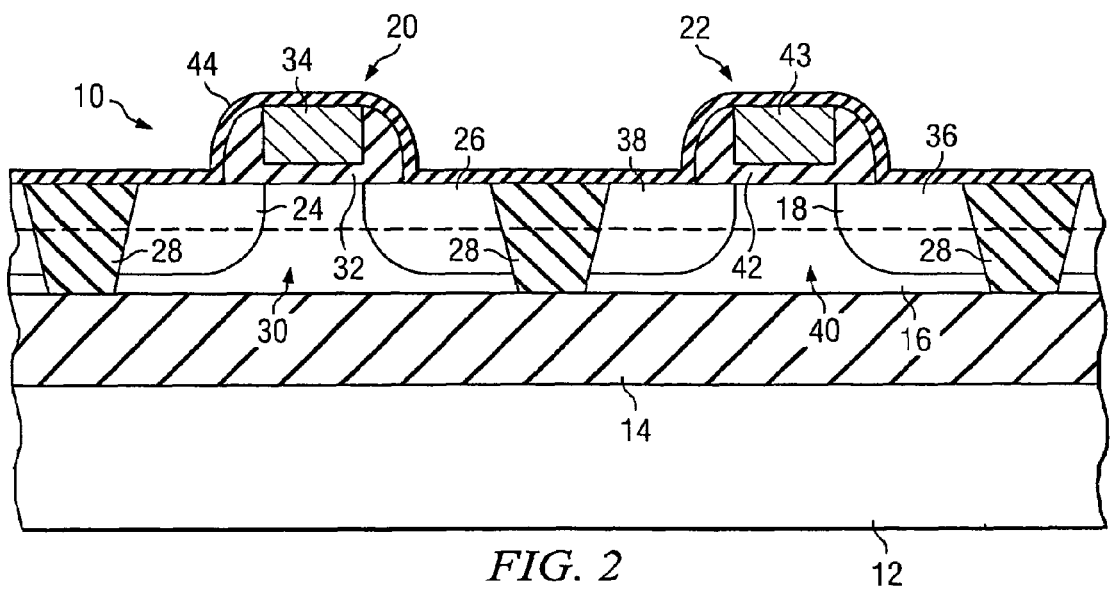
FIG. 2 is a cross-sectional view of a first embodiment of the present invention.

FIG. 2 shows an alternate embodiment that further includes a thin film layer 44 disposed over the source/drain regions 24, 26, 36 and/or 38. As examples, the thin layer 44 can be formed of an oxide (e.g., silicon dioxide), a nitride (e.g., silicon nitride), or a combination of nitride and oxide (e.g., SiON or a composite layer). Any other layer that induces stress could alternatively, or additionally, be used. In the preferred embodiment, the layer 44 is formed to a thickness of between about 200 Å and about 800 Å.

In one embodiment, the thin film layer 44 has a tensile stress that induces tensile strain on the second semiconducting material layer 18. In this embodiment, the preferred material is an insulator, such as one of the insulators discussed above. To understand properties of the materials that cause the inducement of a stress, reference can be made to the papers by Tiwari et al., International Electron Device Meeting 1997, pp. 939–941 and Ootsuka, et al., International Electron Device Meeting 2000, pp. 575–578.

In an alternate embodiment, the thin film layer 44 has a compressive stress and induces a compressive strain on the first semiconducting material layer 16. In this embodiment, the preferred material is an insulator, such as one of the insulators discussed above. The same film can be used for inducing a compressive stress as a tensile stress, e.g., with an additional process step such as a germanium implantation.

Figure 3:
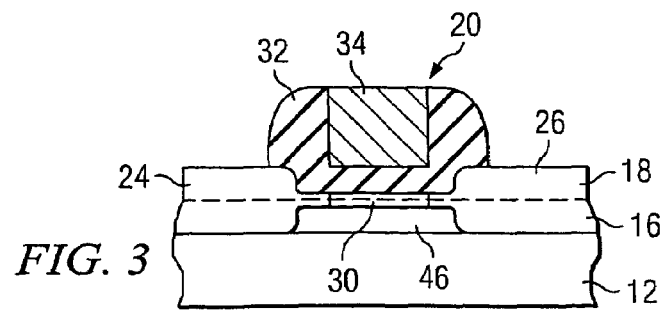
FIG. 3 is a cross-sectional view of a first embodiment of the present invention.

FIG. 3 shows alternate embodiment. In this embodiment, the first semiconducting material layer 16 is isolated from the substrate 12 by an air tunnel 46. As shown in the figure, the portion of the layer 16 that includes a transistor, e.g., the active area is the portion that overlies the air tunnel 46. Further information on device that includes an air tunnel can be found in Jurczak et al., "Silicon-on-Nothing (SON)—an Innovative Process for Advanced CMOS," IEEE Transactions on Electron Devices, Vol. 47, No. 11, November 2000, pp. 2179–2187, which paper is incorporated herein by reference. Also incorporated herein by reference is U.S. Patent Application Publication No. 2002/0076899, entitled "Process for fabricating a substrate of the silicon-on-insulator or silicon-on-nothing type and resulting device."

Figure 4A:
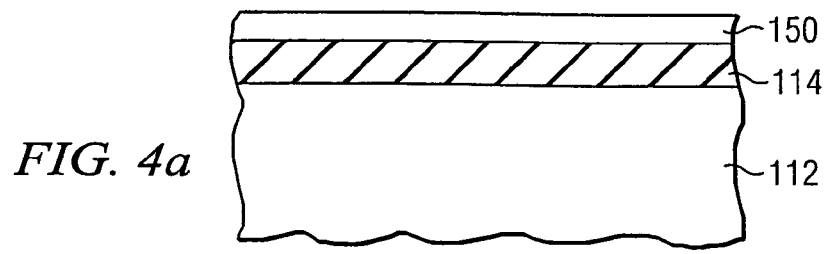
FIGS. 4a–4d are cross-sectional views during fabrication of an embodiment of the present invention.

A preferred method of forming a semiconductor device will now be described with reference to FIGS. 4a–4d. Referring lust to FIG. 4a, a semiconductor-on-insulator (SOI) substrate includes a silicon layer 150 that overlies an insulating layer 114. The insulating layer 114 is disposed on a substrate 112. The layer 150 is preferably silicon, the layer 114 is preferably silicon dioxide, and the layer 112 is preferably silicon. It is understood that other materials could be used in addition to or in replacement of the materials shown.

In the preferred embodiment, the silicon layer 150 is a monocrystalline silicon layer, preferably having a thickness less than about 400 Å. This layer is preferably doped for the n-well (e.g., arsenic or phosphorus) and the p-well (e.g., boron). The silicon layer 150 may be epitaxially deposited on insulator 114. Alternatively, the insulator 114 could have been formed by implantation into the substrate 112 with the top layer 150 having been recrystallized.

Figure 4B:
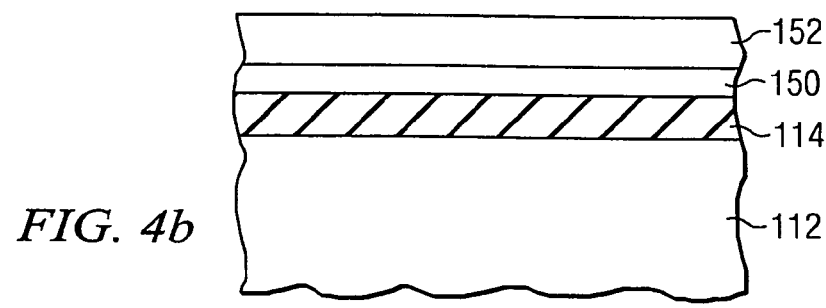

Referring now to FIG. 4b, a $Si_{1-x}Ge_x$ layer 152 is formed over the SOI substrate 150/114/112. Preferably, the $Si_{1-x}Ge_x$ layer 152 is epitaxially grown as a substantially monocrystalline layer. For example, the epitaxial layer can be grown by ultra high vacuum chemical vapor deposition (UH-VCVD) or molecular beam epitaxy (MBE). Polycrystalline and amorphous layers are also possible. This layer 152 is preferably grown to a thickness less than about 400 Å. The variable x is a number between 0 and 1 and is typically between about 0.05 and about 0.2.

Figure 4C:
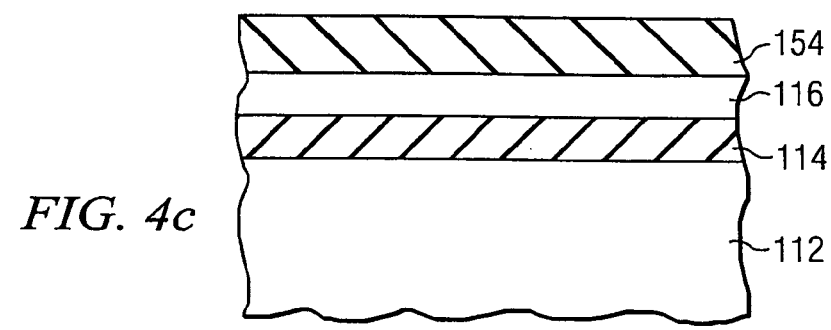

Referring to FIG. 4c, the $Si_{1-x}Ge_x$ layer is oxidized thereby forming an oxide layer 154. The oxide layer 154 is preferably formed by thermal oxidation to form a silicon dioxide layer using standard thermal oxidation processes. During the oxidation process Ge atoms are driven from an upper surface of the $Si_{1-x}Ge_x$ layer 152 into the remaining portion of the $Si_{1-x}Ge_x$ layer 152 and the silicon layer 150. This creates a relaxed (i.e., without stress) $Si_{1-y}Ge_y$ layer, where y is a number between 0 and 1. In the preferred embodiment, y is greater than x. The variable y is typically between about 0.1 and about 0.3, preferably about 0.2.

Figure 4D:
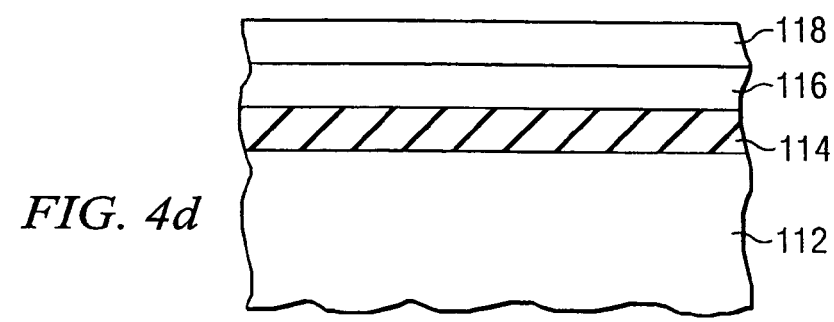

As shown in FIG. 4d, the oxide layer 154 that was formed during the oxidizing step is removed. This removal can be done by standard wet or dry etching, e.g., with an HF etch. A second silicon layer 118 is then formed over the $Si_{1-y}Ge_y$ layer. Preferably, the second silicon layer 118 induces a compressive stress in the relaxed $Si_{1-y}Ge_y$ layer 116. For example, the silicon layer 118 can have a thickness that is less than the critical thickness but still thick enough to induce a compressive stress in the $Si_{1-y}Ge_y$ layer 116. In typical embodiments, the silicon layer 118 is typically less than about 400 Å thick.

In the preferred embodiment, the second silicon layer 118 and the $Si_{1-y}Ge_y$ layer 116 have a combined thickness of less than about 40 nm. In addition, the second silicon layer preferably has a thickness $t_{Si}$ and the $Si_{1-y}Ge_y$ layer has a thickness $t_{SiGe}$, where the ratio of $t_{Si}$ to $t_{SiGe}$ is greater than about 0.3 (e.g., $t_{Si}/t_{SiGe}>0.3$).

While not shown in these figures, the transistors 22 and 22 (see e.g., FIG. 1) can be formed using standard processing. For example, a gate oxide layer can be formed followed by a gate layer. Either of these layers can be composite layers. These are then etched to form the gate regions. The source/drain regions can then be doped (using appropriate masking for a CMOS process). As shown in FIG. 1, sidewall spacers can be included on the gates. Contacts and metalization (which are not shown in any of the figures) can then be used to connect the transistors into the appropriate circuits.

The scope of the present application is not intended to be limited to the particular embodiments of the circuit, process, machine, manufacture, means, methods and steps described in the specification. As one of ordinary skill in the art will readily appreciate from the disclosure of the present invention, circuits, components, processes, machines, manufacture, means, methods, or steps, presently existing or later to be developed, that perform substantially the same function or achieve substantially the same result as the corresponding embodiments described herein may be utilized according to the present invention. Accordingly, the appended claims are intended to include within their scope such circuits, components, processes, machines, manufacture, means, methods, or steps.

What is claimed is:

1. A method of making an electron device, the method comprising:

providing a semiconductor-on-insulator (SOI) substrate having a silicon layer overlying an insulating layer, the insulating layer disposed on a substrate;

forming a first epitaxial $Si_{1-x}Ge_x$ layer over the SOI substrate;

oxidizing the $Si_{1-x}Ge_x$ layer so that Ge atoms are driven from an upper surface of the $Si_{1-x}Ge_x$ layer into a remaining portion of the $Si_{1-x}Ge_x$ layer and the silicon layer of the SOI substrate thereby forming a relaxed $Si_{1-y}Ge_y$ layer, wherein y is greater than x;

removing an oxide layer formed during the oxidizing; and forming a second silicon layer over the $Si_{1-y}Ge_y$ layer.

2. The method of claim 1 wherein the second silicon layer induces a compressive stress in the relaxed $Si_{1-y}Ge_y$ layer.

3. The method of claim 2 wherein the second silicon layer has a thickness less than a critical thickness.

4. The method of claim 1 wherein the second silicon layer has a thickness $t_{Si}$ and the $Si_{1-y}Ge_y$ layer has a thickness $t_{SiGe}$ and wherein the ratio of $t_{Si}$ to $t_{SiGe}$ is greater than about 0.3.

5. The method of claim 1 wherein the second silicon layer and the $Si_{1-y}Ge_y$ layer have a combined thickness of less than about 40 nm.

6. The method of claim 5 wherein the $Si_{1-y}Ge_y$ layer has a thickness that is less than about three times a thickness of the second silicon layer.

7. A method of forming a semiconductor device, the method comprising:
  providing a substrate with an insulating layer disposed on a surface thereof;
  forming a first semiconducting material layer over the insulating layer, the first semiconducting material having a compressive stress;
  a forming a second semiconducting material layer over the first semiconducting material layer, the second semiconducting material having a tensile stress; and
  forming a p-channel transistor having a channel in a first portion of the second semiconducting material layer and forming an n-channel transistor having a channel in a second portion of the second semiconducting material layer.

8. The method of claim 7 wherein the first and second semiconducting material layers have different lattice constants such that the first semiconducting material layer is compressive and the second semiconducting material layer is tensile.

9. The method of claim 1 wherein the $Si_{1-x}Ge_x$ layer is formed by ultra high vacuum chemical vapor deposition.

10. The method of claim 1 wherein the $Si_{1-x}Ge_x$ layer is formed by molecular beam epitaxy.

11. The method of claim 1 wherein oxidizing the $Si_{1-x}Ge_x$ layer comprises performing a thermal oxidation.

12. The method of claim 1 wherein oxidizing the $Si_{1-x}Ge_x$ layer comprises forming silicon dioxide.

13. The method of claim 1 and further comprising forming a transistor in the second silicon layer.

14. The method of claim 7 wherein forming a first semiconducting material layer comprises forming a $Si_{1-x}Ge_x$ layer and wherein forming a second semiconducting material layer comprises forming a silicon layer.

15. A method of forming a semiconductor device, the method comprising:
  providing a substrate with an insulating layer disposed on a surface thereof;
  forming a first semiconducting material layer on the insulating layer, the first semiconducting material having a compressive stress; and
  a forming a second semiconducting material layer on the first semiconducting material layer, the second semiconducting material baying a tensile stress;
  wherein forming a first semiconducting material layer comprises forming a $Si_{1-y}Ge_y$ layer and wherein forming a second semiconducting material layer comprises forming a silicon layer; and
  wherein the first semiconducting material layer is deposited on a lower silicon layer, the lower silicon layer overlying the insulating layer.

16. The method of claim 15 and further comprising:
  oxidizing the first semiconducting material layer prior to forming the second semiconducting material layer; and
  removing any oxide from the first semiconducting material layer prior to forming the second semiconducting material layer.

17. The method of claim 7 wherein the first and second semiconducting material layers have a combined thickness of less than about 40 nm.

18. The method of claim 7 wherein the first semiconducting material layer and the second semiconducting material layer each have a thickness and wherein the ratio of the thickness of the second semiconducting material layer to the thickness of the first semiconducting material layer is greater than about 0.3.

19. The method of claim 18 wherein the first and second semiconducting material layers have a combined thickness of less than about 40 nm.

20. The method of claim 7 and further comprising:
  oxidizing the first semiconducting material layer prior to forming the second semiconducting material layer; and
  removing any oxide from the first semiconducting material layer prior to forming the second semiconducting material layer.

21. The method of claim 15 and further comprising forming a p-channel transistor in a first portion of the second silicon layer and forming an n-channel transistor in a second portion of the second silicon layer.

22. The method of claim 15 wherein the first and second semiconducting material layers have a combined thickness of less than about 40 nm.

23. The method of claim 15 wherein the first semiconducting material layer and the second semiconducting material layer each have a thickness and wherein the ratio of the thickness of the second semiconducting material layer to the thickness of the first semiconducting material layer is greater than about 0.3.

24. The method of claim 23 wherein die first and second semiconducting material layers have a combined thickness of less than about 40 nm.

* * * * *

UNITED STATES PATENT AND TRADEMARK OFFICE
CERTIFICATE OF CORRECTION

PATENT NO. : 7,029,994 B2
APPLICATION NO. : 11/083537
DATED : April 18, 2006
INVENTOR(S) : Ke et al.

It is certified that error appears in the above-identified patent and that said Letters Patent is hereby corrected as shown below:

Column 5, line 33: delete "lust" and insert --first--.
Column 7, line 33: delete "1" and insert --11--.
Column 7, line 50: delete "baying" and insert --having--.
Column 8, line 46: delete "die" and insert --the--.

Signed and Sealed this

Twenty-seventh Day of March, 2007

JON W. DUDAS
*Director of the United States Patent and Trademark Office*